United States Patent [19]
Zibert

[11] Patent Number: 5,978,296
[45] Date of Patent: Nov. 2, 1999

[54] METHOD FOR READING AND REFRESHING A DYNAMIC SEMICONDUCTOR MEMORY

[75] Inventor: Martin Zibert, Feldkirchen-Westerham, Germany

[73] Assignee: Siemens Aktiengesellschaft, Munich, Germany

[21] Appl. No.: 09/205,624

[22] Filed: Dec. 4, 1998

Related U.S. Application Data

[63] Continuation of application No. PCT/EP97/02887, Jun. 4, 1997.

[30] Foreign Application Priority Data

Jun. 4, 1996 [EP] European Pat. Off. .............. 96108955

[51] Int. Cl.$^6$ .................................................. G11C 11/406
[52] U.S. Cl. ............................................................ 365/222
[58] Field of Search .................................... 365/222, 233, 365/233.5

[56] References Cited

U.S. PATENT DOCUMENTS

| | | | |
|---|---|---|---|
| 4,106,108 | 8/1978 | Cislaghi et al. | 365/222 |
| 4,691,303 | 9/1987 | Churchward et al. | 365/222 |
| 4,914,630 | 4/1990 | Fujishima et al. | 365/222 |
| 5,251,177 | 10/1993 | Akamatsu et al. | 365/222 |
| 5,253,211 | 10/1993 | Suzuki . | |
| 5,488,581 | 1/1996 | Nagao et al. | 365/189.05 |

FOREIGN PATENT DOCUMENTS

| | | |
|---|---|---|
| 0097778A2 | 1/1984 | European Pat. Off. . |
| 0170285A2 | 2/1986 | European Pat. Off. . |

OTHER PUBLICATIONS

"Trends in High–Speed DRAM Architecture", Kumanoya et al., IEICE Trans. Electron. vol. E 79–C, No. 4, Apr. 1996, pp. 472–481.

*Primary Examiner*—Tan T. Nguyen
*Attorney, Agent, or Firm*—Herbert L. Lerner; Laurence A. Greenberg

[57] ABSTRACT

The invention relates to a method for reading and refreshing data contents of a dynamic semiconductor memory having many volatile memory cells disposed in columns and rows in a matrix. The reading of the data contents from addressed memory cells is done with the aid of at least two data buses. The data contents are applied word by word to the data buses and a refreshing of the data contents of the memory cells is effected by a refresh pulse. According to the invention, it is provided that the data words applied to the data buses after the triggering of the refresh pulse are maintained for a predetermined period of time on all the data buses and only after that are the data words removed by of a shutoff pulse.

9 Claims, 1 Drawing Sheet

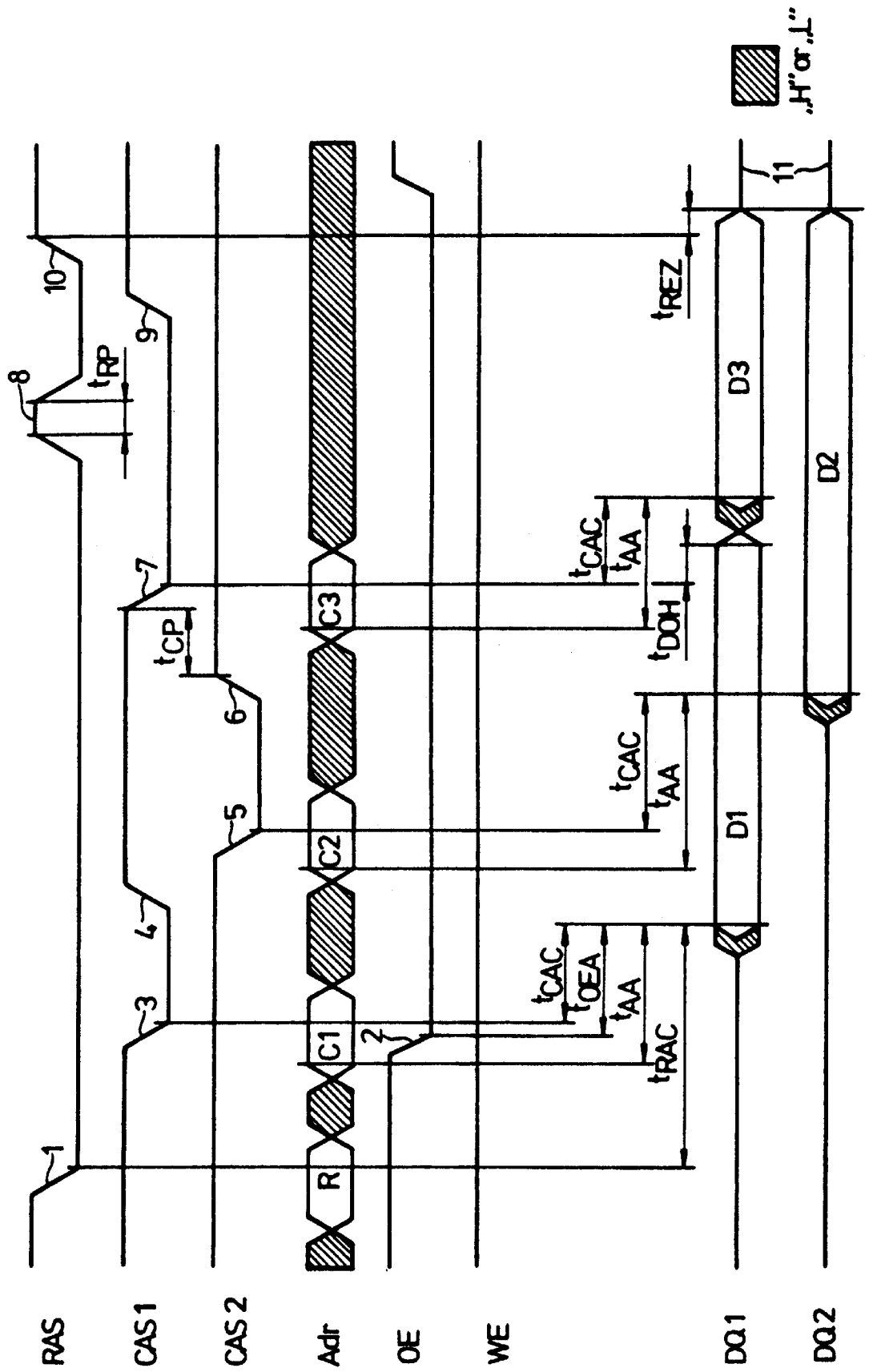

METHOD FOR READING AND REFRESHING A DYNAMIC SEMICONDUCTOR MEMORY

CROSS-REFERENCE TO RELATED APPLICATION

This is a continuation of copending International Application PCT/EP97/02887, filed Jun. 4, 1997, which designated the United States.

BACKGROUND OF THE INVENTION

Field of the Invention

The invention relates to a method for reading and refreshing the data contents of a dynamic semiconductor memory having many volatile memory cells disposed in columns and rows in a matrix. The reading of data contents from addressed memory cells is done by at least two data buses, to which the data contents are applied word by word, and the refreshing of the data contents of the memory cells is effected by a refresh pulse.

In dynamic semiconductor memories, the storage of information is done by the application and removal of charges to and from a capacitor assigned to each memory cell. The capacitor is coupled to a selection transistor which is triggerable via a word line and by way of which the capacitor is charged and discharged. The information flows from and to the memory cell via a bit line that is also connected to the selection transistor. In reading, the addressed cell is switched to the bit line, which causes the charge ratios on the bit line to change. By activation of read amplifiers, the change in charge in the bit line is reinforced for outputting a logical 1 or logical 0. Over time, the capacitor is known to lose its charge because of current leakage, so that the information in the memory cell has to be refreshed at regular intervals. The signals and signal combinations for the functions of reading, writing and refreshing that are needed to trigger the dynamic semiconductor memory are standardized. One such standard, which is fundamental to the subject of the invention, with a very efficient method for reading and simultaneously refreshing data contents is known as the "enhanced data out" mode with a "hidden refresh" under the EDO specification. The enhanced data out mode enables rapid access to the data of a row, since the data, unlike most other data output modes, are not turned off upon deactivation of the column address signal. The currently present data thus remain active until the next data are applied to the output. As a result, the data are available for further processing, for instance by a processor. The hidden refresh was introduced to reduce hardware expense. Outside the semiconductor memory it is merely determined when a refresh is to be done. Which data word will be refreshed is determined inside the memory. To that end, an internal address counter is provided which is incremented by one upon each refresh instruction and outputs a counter address that is supplied as a row address to an internal logic circuit. For detecting a refresh instruction, a column address signal is activated before a row address signal, so that the function of a column address or row address can be allocated to an address present on the address bus. During the refreshment, the data word to be output is continuously applied actively to the data bus, and the processor can utilize the time for further processing the data word, while memory cells are being refreshed at the same time. In a dynamic semiconductor memory with two or more data buses, under the enhanced data out standard (EDO standard), one signal input for application of a column address signal is provided for every data bus. During an enhanced data out mode with hidden refresh, on the one hand only the column address signal to whose associated data bus a data word was last applied is active. The hidden refresh is initiated by a chronologically limited deactivation of the row address signal, in a passive state of at least one column address signal, which on the other hand causes deactivation of the data words on the data buses associated with the passive column address signals. Thus only the last data word applied to the data bus assigned to the active column address signal remains active and available to the processor, while the other data buses remain unused until the next data words to be read out are activated, and the turned off data words for a processor, for instance, are no longer available.

SUMMARY OF THE INVENTION

It is accordingly an object of the invention to provide a method for reading and refreshing a dynamic semiconductor memory which overcomes the above-mentioned disadvantages of the prior art methods of this general type, in which the refresh instruction is not turned off for any of the data words present on the data buses for reading purposes.

With the foregoing and other objects in view there is provided, in accordance with the invention, an improved method for reading and refreshing data contents of a dynamic semiconductor memory having many volatile memory cells disposed in columns and rows in a matrix, the improvement which includes: reading the data contents from addressed memory cells and applying the data contents in the form of data words word by word to at least two data buses; refreshing the data contents of the memory cells with a refresh signal; maintaining the data words applied to the at least two data buses after a triggering of the refresh signal for a predetermined period of time on the at least two data buses; and applying a shutoff pulse after an expiration of the predetermined period of time for turning off the data words on the at least two data buses.

In accordance with a feature of the invention, there are the steps of: a) transitioning a row address signal into an active state for applying a row address to an address bus; b) transitioning one of two column address signals into the active state for applying a column address to the address bus; c) transitioning briefly the row address signal to a passive state and correspondingly maintaining at least one of the two column address signals in the passive state for producing the refresh signal; and d) transitioning the row address signal and the two column address signals to the passive state for turning off the data words on the at least two data buses.

According to the invention, it is provided that the data words applied to the data buses after the triggering of the refresh pulse are maintained for a predetermined period of time on all the data buses and only after that are they turned off by a shutoff pulse. This is equivalent to an effective change in the truth table of the circuit logic of a dynamic semiconductor memory with two or more data buses that is specified for the enhanced data out mode by the EDO standard. This can be accomplished by a comparatively slight change in the internal logic of the circuit of the semiconductor memory specified to suit the enhanced data out mode (EDO). Compared with the enhanced data out mode (EDO) with hidden refresh, the invention has the advantage that all the data words present on the data buses for reading purposes at the moment of the refresh instruction are also present on the data buses during the refresh and are not turned off until the shutoff pulse is received. As a result, during refreshing, a data word is made available for further processing to the processor on each data bus, without restricting the other effective possibilities offered by the EDO standard.

In accordance with the principle of the invention, it may be provided that a row address is associated with the address present on an address bus by a transition of a row address signal into the active state. A column address is associated with the address present on the address bus by a transition of a column address signal into the active state. A brief active state of the row address signal at a correspondingly passive state of at least one column address signal, corresponds to the refresh signal. All of the data words present on the data buses are turned off by the transition of the row address signal into the passive state, at a simultaneously passive state of the two column address signals. The effect of this is that within a reading state turned on by an active read signal, a data word is present on a data bus until such time as a further data word from the memory cells is applied to the same data bus. As a result, the data words present on the data buses are available to the processor for the maximum possible length of time. Because the shutoff pulse includes a transition of the row address signal to the passive state, with at the same time passive states of all the column address signals, no data word present on the data buses is turned off by the refresh pulse, which in turn includes a chronologically limited state of the row address signal during a passive state of at least one column address signal. Not until a transition of the row address signal to the passive state, when at the same time all the column address signals are in the passive state, are the data words present on the data buses turned off. In a dynamic semiconductor memory constructed according to the invention, even in a reading state without hidden refresh, the data words present on the data buses are not turned off until the row address signals and column address signals are simultaneously passive, but this presents no disadvantage, since the further turnoff possibilities of the data words present on the data buses, which possibilities are involved in a transition of the read signal to the passive state or of the write signal to the active state, remain unaffected.

For the application of a data word to be read out to a data bus, it is provided that after the transition of the row address signal, the transition of a read signal, and the transition of the column address signal to the active state, the data word stored in the addressed memory cells is applied to the data bus associated with the column address signal in the active state.

To maximize the duration of the application of data words to be read out, it can also advantageously be provided that in an active state of the row address signal and the read signal and a passive state of the column address signal and the write signal, the data word present on the data bus associated with the column address signal in the passive state continues to be maintained. For applying a data word to be read out, it is necessary under the EDO specification that the column address signals assigned to all the other data buses be in the passive state. Because the appropriate data word continues to be applied as a result of the transition of the column address signal, the chronological interval between the application of two data words can be kept short.

To enable reliable output of the data words to other circuits coupled to the data buses, it may be provided that a tristate condition is turned on in all the data buses, in a passive state of the row address signal and of all the column address signals.

As a further provision for triggering the semiconductor memory to output data, it can advantageously be provided that in an active state of the row address signals and column address signals and a passive state of the write signal, setting the read signal to the active state puts the semiconductor memory in a reading state.

For the sake of unambiguous definition of the reading state or writing state, it can advantageously be provided that in an active state of the row address signal, column address signals and read signal, the transition of the write signal to the active state is blocked.

In a preferred embodiment it may be provided that logical 0 corresponds to the active state, and logical 1 corresponds to the passive states of the binary control signals.

Other features which are considered as characteristic for the invention are set forth in the appended claims.

Although the invention is illustrated and described herein as embodied in a method for reading and refreshing a dynamic semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a timing diagram of a memory cell according to the invention.

DESCRIPTION OF THE PREFERRED EMBODIMENTS

Referring now to the single figure of the drawing in detail, there is shown courses over time of a row address signal RAS (for "row access strobe"), column address signals CAS1 and CAS2 (for "column access strobe") assigned respectively to the two data buses DQ1 and DQ2, a read signal OE (for "output enable") and a write signal WE (for "write enable"), as well as the row addresses R and column addresses C1, C2, C3 that are applied to an address bus Adr, and data words D1, D2, D3 applied to the two data buses DQ1, DQ2 during a reading state with hidden refresh in a dynamic semiconductor memory. The triggering of a dynamic semiconductor memory by the row address signal RAS, the first column address signal CAS1 assigned to the first data bus DQ1, the second column address signal CAS1 assigned to the second data bus DQ2, the read signal OE and the write signal WE on an EDO standard with clocked pulses are familiar to one skilled in the art and need not be explained in all their details at this point. The JEDEC specification for DRAMs, extended data output (EDO), is hereby expressly incorporated by reference.

The control signals are initially in a passive state, that is, at logical 1 or at a higher voltage level of approximately +5 V. By a transition, shown by reference numeral 1, of the row address signal RAS to the active state, a first address applied to the address bus Adr is assigned the function of a row address R. The activation 2 of the read signal OE puts the semiconductor memory in a reading state and enables the output of data from the memory cells. The activation 3 of the first column address signal CAS1 that ensues briefly thereafter assigns the function of a first column address C1 to a second address present on the address bus Adr. The first row address R and the first column address C1 are assigned to a group of memory cells and define the data word D1 deposited in the group of memory cells. The activated first column address signal CAS1 defines the data bus DQ1 assigned to the first column address signal CAS1; and the read signal OE in the active state specifies that the semiconductor memory is in the reading state. Thus the first data word D1, assigned to the first row address R and the first column address C1, is applied to the first data bus DQ1. After a deactivation 4 of the first column address signal CAS1, the first data word D1 remains active on the first data bus DQ1. Thus other circuit elements, such as a processor communicating with the semiconductor memory, continue to be available. By the activation 5 of the second column address signal CAS2, a third address present on the address bus Adr is assigned the function of a second column address C2, and the second data word D2 assigned to the row address R and the second column address C2 is applied to the second data bus DQ2. After the deactivation 6 of the second column address signal CAS2, the second data word D2 remains active on the second data bus DQ2 and can thus continue to be read by the processor as well. After a further activation 7 of the first column address signal CAS1, the fourth address present on the address bus Adr is assigned the function of a third column address C3, and the third data word D3 assigned to the row address R and the third column address C3 is applied to the first data bus DQ1. The first data word D1 remains active to just before the application of the third data word D3. To this extent, the implementation described of the data words D1, D2, D3 present on the data buses DQ1, DQ2 is equivalent, because of the states of the control signals RAS, CAS1, CAS2, OE, WE, to the standardized enhanced data out mode (EDO). The time segments designated in the drawing have the following meaning:

$t_{RAC}$ maximum access time after the row address signal, $t_{AA}$ maximum access time after the column address, $t_{OEA}$ maximum access time after the read signal, $t_{CAC}$ maximum access time after the column address signal, $t_{CP}$ minimum time between two column address signals, $t_{DOH}$ minimum holding time of the prior CAS access, $t_{RP}$ chronological duration of the refresh instruction, and $t_{REZ}$ maximum shutoff time of the data output, referring to the shutting off of the row address signal.

For the signals shown in shaded form in the drawing on the address bus Adr and the data buses DQ1, DQ2, either logical 1 or logical 0 is present on all the bit lines. For the signals, shown in the drawing by a horizontal line, of the data buses DQ1, DQ2, the respective data bus DQ1 or DQ2 is in a tristate condition.

According to the invention, it is provided that a refreshing of the memory cells is disposed by a deactivation 8, limited to a period of time $t_{RP}$ of the row address signal RAS. Upon the deactivation 8 of the row address signal RAS, while the column address signal CAS2 is in the passive state, at least one of the column address signals CAS1 is made active. After another deactivation 9 of the first column address signal CAS1, the second data word D2 on the second data bus DQ2 and the third data word D3 on the first data bus DQ1 continue to be active and available to the processor. Only upon the deactivation 10 of the row address signal RAS are the two data words D2, D3 turned off and only then are the data buses DQ1, DQ2 put into the tristate condition 11. Even upon reading without refreshment, the data words D2, D3 to be read out and present on the data buses DQ1, DQ2 would not be turned off until the row address signal RAS and the two column address signals CAS1, CAS2 are in the passive state, and as a result the EDO specification is unrestricted and there are no disadvantages, since upon a transition of the read signal (OE) to the passive state, or a transition of the write signal (WE) to the active state, further turnoff possibilities still exist.

I claim:

1. An improved method for reading and refreshing data contents of a dynamic semiconductor memory having many volatile memory cells disposed in columns and rows in a matrix, the improvement which comprises:

reading the data contents from addressed memory cells and applying the data contents in the form of data words word by word to at least two data buses;

refreshing the data contents of the memory cells with a refresh signal;

maintaining the data words applied to the at least two data buses after a triggering of the refresh signal for a predetermined period of time on the at least two data buses; and applying a shutoff pulse after an expiration of the predetermined period of time for turning off the data words on the at least two data buses.

2. The method according to claim 1, which comprises:

a) transitioning a row address signal into an active state for applying a row address to an address bus;

b) transitioning one of two column address signals into the active state for applying a column address to the address bus;

c) transitioning briefly the row address signal to a passive state and correspondingly maintaining at least one of the two column address signals in the passive state for producing the refresh signal; and d) transitioning the row address signal and the two column address signals to the passive state for turning off the data words on the at least two data buses.

3. The method according to claim 2, which comprises transitioning the row address signal and the two column signals to the passive state for putting the at least two data buses in a tristate condition.

4. The method according claim 2, which comprises associating the active state with a logical zero and the passive state with a logic one.

5. The method according to claim 1, which comprises:

a) transitioning a row address signal into an active state for applying a row address to an address bus;

b) transitioning a read signal to the active state; and c) transitioning a column address signal into the active state for applying a column address to the address bus causing the data words stored in the addressed memory cells to be applied to one of the at least two data buses associated with the column address signal in the active state.

6. The method according to claim 1, which comprises:

a) transitioning a row address signal into an active state for applying a row address to an address bus;

b) transitioning one of two column address signals into the active state for applying a column address to the address bus;

c) setting a write signal in a passive state; and e) setting a read signal to the active state for putting the semiconductor memory in a reading state.

7. The method according to claim 1, which comprises transitioning a row address signal, a read signal and column address signals to an active state for blocking a transition of a write signal to the active state.

8. The method according to claim 1, which comprises:

a) transitioning a row address signal into an active state for applying a row address to an address bus;

b) transitioning a read signal to the active state;

c) transitioning a column address signal into the active state for applying a column address to the address bus causing the data words stored in the addressed memory cells to be applied to at least one of the at least two data buses associated with the column address signal in the active state;

d) placing a write signal in a passive state; and e) transitioning the column address signal to the passive state causing the data words present on the at least two data buses to be maintained.

9. The method according claim 8, which comprises associating the active state with a logical zero and the passive state with a logic one.

* * * * *